(12) United States Patent
Li et al.

(10) Patent No.: US 10,629,507 B1
(45) Date of Patent: Apr. 21, 2020

(54) SYSTEM IN PACKAGE (SIP)

(71) Applicant: Dialog Semiconductor (UK) Limited, London (GB)

(72) Inventors: Che-Han Jerry Li, Taichung (TW); Jesus Mennen Belonio, Jr., Neubiberg (DE); Ernesto Gutierrez, III, Swindon (GB); Shou Cheng Eric Hu, Taichung (TW)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/198,988

(22) Filed: Nov. 23, 2018

(51) Int. Cl.
| | |
|---|---|
| *H01L 23/48* | (2006.01) |
| *H01L 29/40* | (2006.01) |
| *H01L 23/13* | (2006.01) |
| *H01L 23/538* | (2006.01) |
| *H01L 21/56* | (2006.01) |
| *H01L 23/31* | (2006.01) |
| *H01L 21/48* | (2006.01) |
| *H01L 23/498* | (2006.01) |

(52) U.S. Cl.
CPC .......... *H01L 23/13* (2013.01); *H01L 21/4853* (2013.01); *H01L 21/56* (2013.01); *H01L 23/3185* (2013.01); *H01L 23/49816* (2013.01); *H01L 23/5386* (2013.01)

(58) Field of Classification Search
CPC ... H01L 23/49816; H01L 21/78; H01L 21/56; H01L 23/49827; H01L 23/3114; H01L 21/561; H01L 23/5389; H01L 21/4853; H01L 23/3135; H01L 23/3192; H01L 23/5226; H01L 23/5386; H01L 21/76885; H01L 23/3178; H01L 23/5383
USPC .......................................................... 257/738
See application file for complete search history.

(56) References Cited

U.S. PATENT DOCUMENTS

| | | | |
|---|---|---|---|
| 8,581,405 | B2 | 11/2013 | Dertinger et al. |
| 9,530,714 | B2 | 12/2016 | Kalchuri et al. |
| 9,565,774 | B2 | 2/2017 | Lee |
| 9,601,435 | B2 | 3/2017 | Kim et al. |
| 9,711,502 | B2 | 7/2017 | Huang et al. |
| 10,049,961 | B1 | 8/2018 | Qi et al. |
| 10,446,509 | B2 * | 10/2019 | Shih .................... H01L 25/0655 |
| 2015/0061139 | A1 | 3/2015 | Yap |

(Continued)

OTHER PUBLICATIONS

German Office Action, File Number: 10 2019 203 362.8, Applicant: Dialog Semiconductor (UK) Limited, dated Nov. 22, 2019, 8 pages, and English language translation, 8 pages.

*Primary Examiner* — Theresa T Doan
(74) *Attorney, Agent, or Firm* — Saile Ackerman LLC; Stephen B. Ackerman; Rosemary L. S. Pike

(57) ABSTRACT

A system in package is described comprising a substrate having a top side and a bottom side, having redistribution layers therein, and having a cavity extending partially into the top side of the substrate. At least one passive component is mounted on the top side of the substrate and into the cavity and embedded in a first molding compound. At least one silicon die is mounted on the bottom side of the substrate and embedded in a second molding compound wherein electrical connections are made between the at least one silicon die and the at least one passive component through the redistribution layers. Solder balls are mounted through openings in the second molding compound to the redistribution layers wherein the solder balls provide package output.

8 Claims, 4 Drawing Sheets

(56) References Cited

U.S. PATENT DOCUMENTS

| | | |
|---|---|---|
| 2016/0174381 A1 | 6/2016 | Lee et al. |
| 2016/0307847 A1 | 10/2016 | Lee et al. |
| 2016/0379961 A1 | 12/2016 | Lee et al. |
| 2017/0141087 A1 | 5/2017 | Vincent et al. |
| 2018/0286780 A1 | 10/2018 | Qi et al. |

\* cited by examiner

SYSTEM IN PACKAGE (SIP)

RELATED PATENT APPLICATION

This disclosure is related to U.S. patent application Ser. No. 15/718,080 filed on Sep. 28, 2017, assigned to the same assignee as the present disclosure, and herein incorporated by reference in its entirety.

(1) TECHNICAL FIELD

This disclosure is related to system in package (SIP) technologies, and more particularly, to SIP technologies integrating a silicon die and passive components through a cavity substrate.

(2) BACKGROUND

The internet of things (IOT) involves billions of mobile devices connected to the cloud with infinite possibilities for data. Each of these devices will require, at a minimum, a microcontroller to add intelligence to the device, one or more sensors to allow for data collection, one or more chips to allow for connectivity and data transmission, and a memory component. Semiconductor device manufacturers are constantly confronted with device integration challenges as consumers want electronics to be smaller, more portable and more multi-functional than ever.

Some traditional system in package (SIP) technologies include embedded die substrates (embedded wafer level package eWLP), die side-by-side wire-bonded SIP's, small outline integrated circuit packages (SOIC), quad flat no-lead packages (QFN), and fan-out type SIP's. Related U.S. patent application Ser. No. 15/718,080 teaches an Embedded Trace Substrate (ETS) System in Package technology integrating Silicon dies and passive components with an ETS substrate as the interconnection between top and bottom sides. It is desired to develop an ultra thin ETS substrate for the thin form factor requirement. Design considerations for the ultra-thin ETS substrate include load-unload, manufacturing process handling, crack risk concern, substrate planarity, and warpage performance.

U.S. Pat. No. 9,565,774 (Lee) and U.S. Patent Applications 2016/0307847 (Lee et al) and 2016/0174381 (Lee et al) disclose methods of forming and using embedded trace substrates (ETS). U.S. Pat. No. 9,711,502 (Huang et al) and U.S. Pat. No. 8,581,405 (Dertinger et al) show components on both sides of a substrate. U.S. Pat. No. 10,049,961 (Qi et al), U.S. Pat. No. 9,601,435 (Kim et al), and U.S. Pat. No. 9,530,714 (Kalchuri et al) describe components embedded in one or more cavities for a thinner package.

SUMMARY

It is the primary objective of the present disclosure to apply SIP technologies to enable low cost integration of packages on wearable, mobile and IOT devices.

It is a further objective of the present disclosure to integrate a silicon die and passive components with thinner total package height and a substrate having a cavity.

Yet another objective is to provide an improved package having taller passive components partially embedded into cavities in a substrate.

A still further objective of the present disclosure is to provide a system in package having a silicon die on one side of an embedded trace substrate (ETS) and passive components on the opposite side of the ETS wherein taller passive components are partially embedded into one or more cavities in the substrate.

In accordance with the objectives of the present disclosure, a system in package is achieved comprising a substrate having a top side and a bottom side, having redistribution layers therein, and having at least one cavity extending partially into the top side of the substrate. At least one passive component is mounted on the top side of the substrate and into the at least one cavity and embedded in a first molding compound. At least one silicon die is mounted on the bottom side of the substrate and embedded in a second molding compound wherein electrical connections are made between the at least one silicon die and the at least one passive component through the redistribution layers. Solder balls are mounted through openings in the second molding compound to the redistribution layers wherein the solder balls provide package output.

Also in accordance with the objectives of the present disclosure, a method to fabricate a system in package is achieved. A substrate is provided having a top side and a bottom side, having redistribution layers therein, and having at least one cavity extending partially into the top side of the substrate. At least one passive component is mounted onto the top side of the substrate and into the at least one cavity wherein the at least one passive component electrically contacts the redistribution layers. The at least one passive component is embedded in a first molding compound. The first molding compound is ground to a desired first molding thickness. At least one silicon die is mounted to the bottom side of the substrate and embedded in a second molding compound. The second molding compound is ground until a bottom side of the at least one silicon die is exposed. Thereafter vias are opened through the second molding compound to solder pads electrically contacting the redistribution layers. Solder balls providing package output are mounted on the solder pads.

BRIEF DESCRIPTION OF THE DRAWINGS

In the accompanying drawings forming a material part of this description, there is shown.

DETAILED DESCRIPTION

Figure 1:
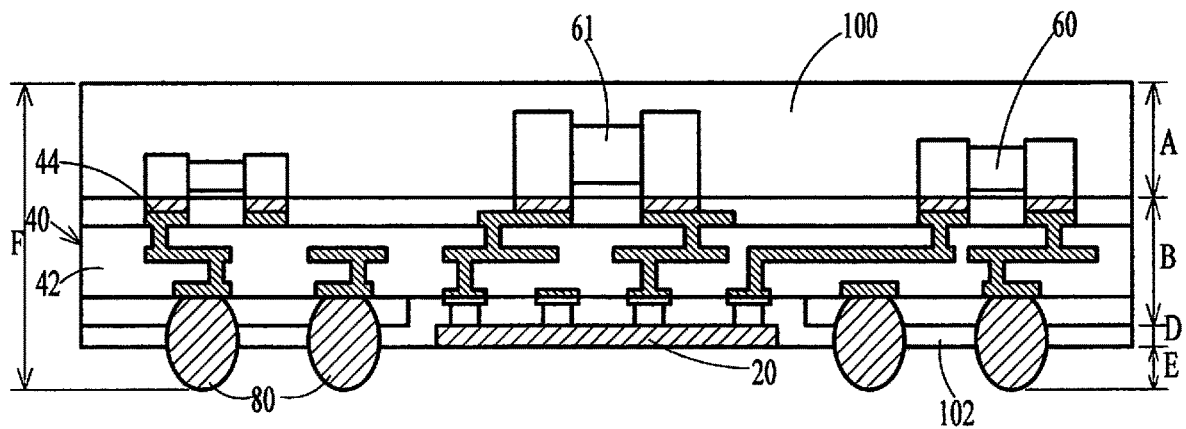
FIG. 1 is a cross-sectional representation of a system in package of the prior art.

Currently, the total package height of an embedded trace substrate system in package (ETS-SiP) product is limited to a maximum of about 850 µm, which is composed of passive component height (up to 500 µm), ETS substrate thickness (now 85 µm), top and bottom molding compound thickness, and solder ball height. FIG. 1 illustrates this ETS-SiP, according to Related patent application Ser. No. 15/718,080, having ETS 40, passive components 60 and 61 embedded in molding compound 100 on one side of the substrate and a die 20 embedded in molding compound 102 on the other side of the ETS. Solder balls 80 are also shown.

It is desired to further decrease the total package thickness for the next generation ETS-SiP, but if we reduce the current substrate thickness, problems will arise, such as substrate manufacturing capability from the suppliers, substrate warpage, and handling and cracking issues due to the substrate thickness being too thin.

We need to create a thinner total package thickness but also consider package robustness and handling. We propose a new design of a substrate with a cavity structure to replace the current ultra thin 85 μm thickness ETS substrate. The critical taller passive components will be mounted into the substrate cavity so that we can decrease the total packaging thickness (Z-Height). Since the taller passive components are embedded into the substrate cavity, the total thickness of the SIP in the Z Direction can be reduced. Then, we can further increase the substrate thickness so that the substrate will have more robustness and rigidity in terms of assembly processing and handling. If we have a deeper cavity thickness, then we can decrease the total package thickness even though the substrate thickness is increased.

Figure 2:
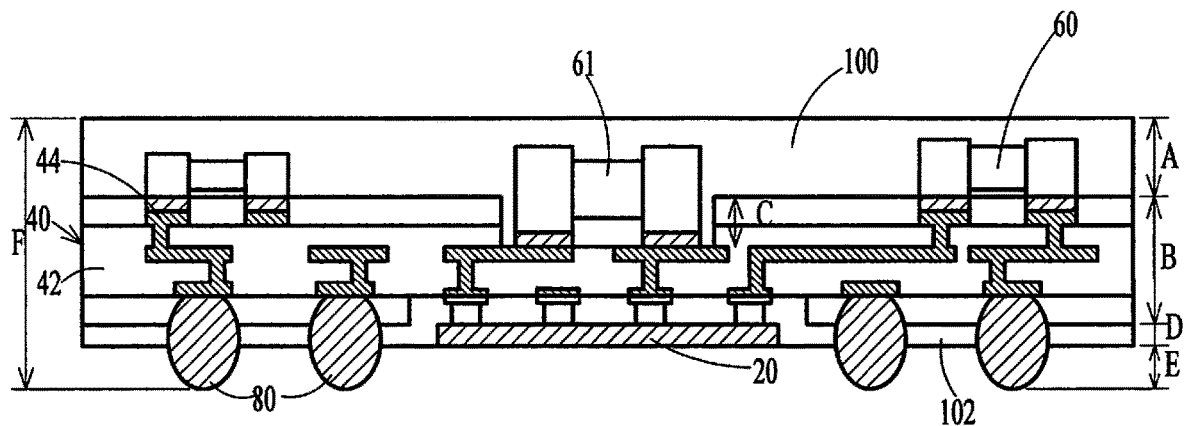
FIG. 2 is a cross-sectional representation of a system in package having a cavity according to a preferred embodiment of the present disclosure.
Figure 3:
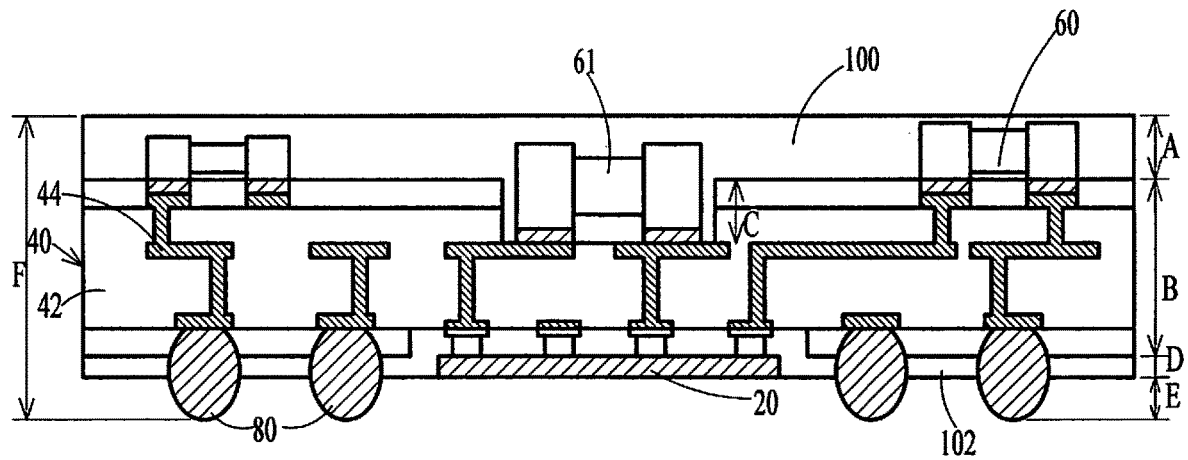
FIG. 3 is a cross-sectional representation of a system in package having a cavity and a thicker substrate according to a preferred embodiment of the present disclosure.

For example, FIG. 1 illustrates an ETS-SiP substrate without a cavity. FIG. 2 illustrates an ETS-SiP with a substrate cavity into which is partially embedded taller passive component 61. FIG. 3 illustrates a thicker ETS with a deeper cavity. Table 1 illustrates sizes (in microns) for all three examples. A is the top mold thickness, B is the ETS substrate thickness, C is the cavity depth, D is the bottom mold thickness, E is the ball protrusion height, and F is the total package thickness.

TABLE 1

| | Size (μm) | ETS-SiP | with cavity substrate | thicker substrate with cavity |
|---|---|---|---|---|
| A | Top mold | 590 | 565 | 475 |
| B | ETS substrate thickness | 85 | 85 | 175 |
| C | Cavity depth | NA | 25 | 115 |
| D | Bottom mold | 80 | 80 | 80 |
| E | Ball protrusion height | 55 | 55 | 55 |
| F | Total package thickness | 810 | 785 | 785 |

As shown in FIGS. 1-3 and Table 1, the ETS-SiP of Related Patent Application Serial No. total package height=810 μm with an 85 μm ETS substrate (FIG. 1), but if we have the cavity substrate design, we can use 25 μm depth cavity (FIG. 2) for a total Z height package thickness of 785 μm. Furthermore, if we increase the substrate thickness to 175 μm and with 115 μm cavity depth (FIG. 3), then we can also get the thinner 785 μm total Z height package thickness. This means that we can decrease the total package Z height by adding the cavity design and we can achieve a more robust substrate and have better handling and manufacturability yield on the substrate and packaging assembly at the same time by increasing the substrate thickness.

The present disclosure integrates a silicon die and passive components by epoxy material, such as a molding compound, with ETS (Embedded Trace Substrate) as the interconnection between both sides. Multiple redistribution layers are embedded in the pre-impregnated insulator layer of the ETS. With through molded vias processed by laser drilling and solder ball attachment, the signal communication between top side devices (passive devices, sensors, memory) and bottom side silicon dies (processor, power management integrated circuit (PMIC), etc.) can be delivered to the bottom solder balls as the output. Better heat dissipation and electrical performance (parasitic capacitance and resistance) can be expected through this embedded trace substrate structure due to a shorter distance between die and the printed circuit board (PCB) connected to the solder balls and shorter signal lines connection between the copper traces and the solder balls compared with a traditional package type.

Figure 4:
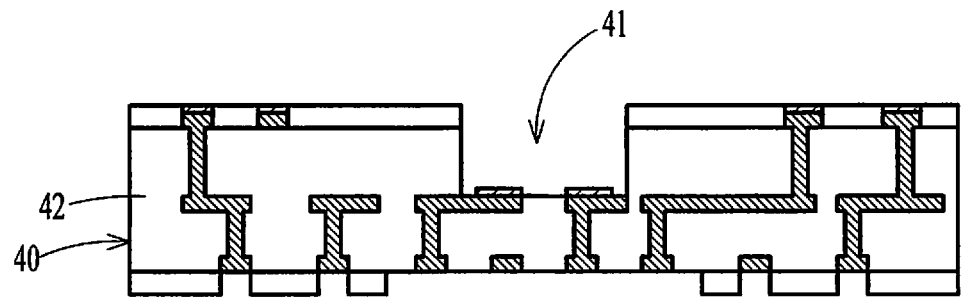
FIGS. 4 through 12 are cross-sectional representations of steps in a process to fabricate the system in package of the present disclosure.

The fabrication process of the SiP of the present disclosure will be further described in detail with reference to FIGS. 4-12. Referring now more particularly to FIG. 4, a cavity type substrate 40 is provided by a supplier. This substrate 40 has a thicker substrate thickness for better manufacturing and handling, based on the cavity area design requirement. Preferably an etching process is used to form the cavity structure 41. The substrate is preferably an ETS including a dielectric layer 42 pre-impregnated with composite fibers in a thermoset polymer matrix such as an epoxy. This dielectric layer 42 serves as an insulator to traces 44 to prevent electrical distortion or shorts within the electrical path of the layers 44. Three copper redistribution layers 44 are illustrated in the drawing figures. There may be more or fewer than three layers, depending on the electrical performance of the package and desired package height. Instead of an ETS, any other suitable substrate type may be used.

Figure 5:
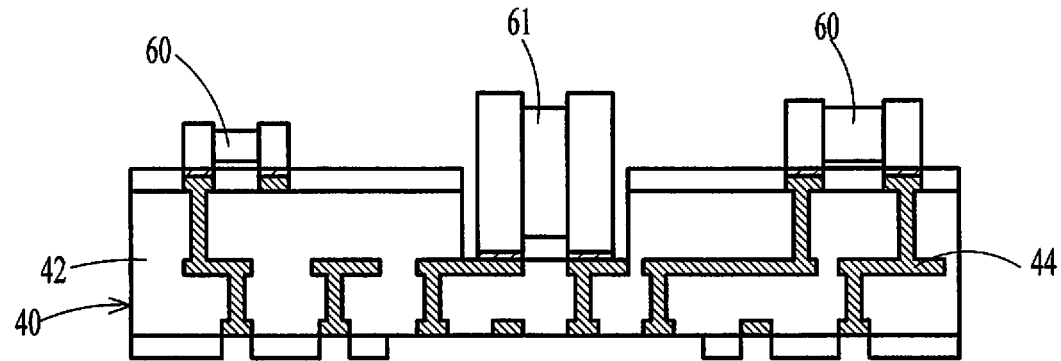

Now, referring to FIG. 5, passive components 60 and 61, such as resistors, capacitors, inductors, or other passive devices such as sensors, memory, or logic, are mounted onto the top side of the substrate using surface mount technology (SMT), such as attaching by solder paste. The passive components 60 and 61 are mounted in openings to the redistribution layers 44.

Figure 6:
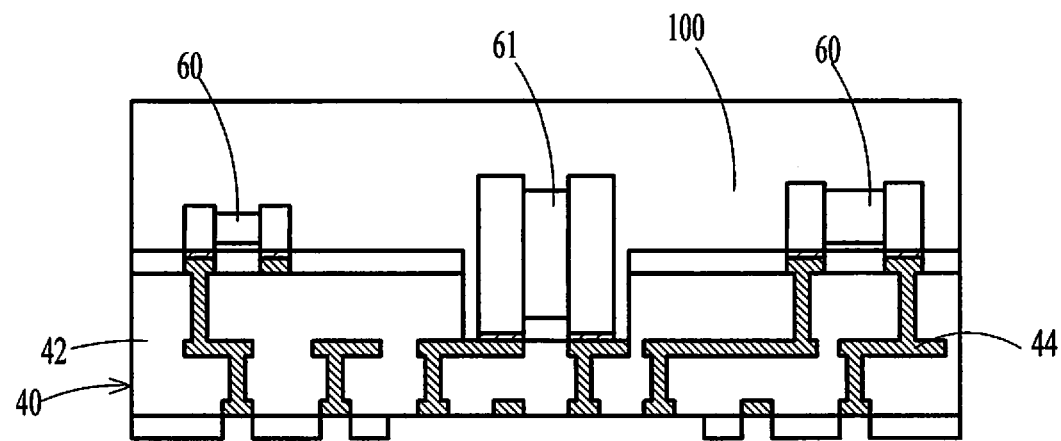

Taller passive components 61 are mounted into the cavity 41. Taller passive components could be up to 500 μm in height. There may be more than one cavity for more than one taller component. After the taller passive component(s) are mounted into the cavity(ies) 41, a top compression molding process is performed using a molding compound 100, such as a granular epoxy resin material with a fine filler, to mold the substrate strip, as shown in FIG. 6. The critical target here is to control the precision of the passive components SMT placement and molding filled into the cavity area. The cavity area may need a finer filler size that can transfer smoothly and completely into the cavity area. For example, the molding 100 is cured at about 175° C. for about 120 seconds. To finish cross-linking, the molding is post-cured at about 175° C. for about 6 hours.

Figure 7:
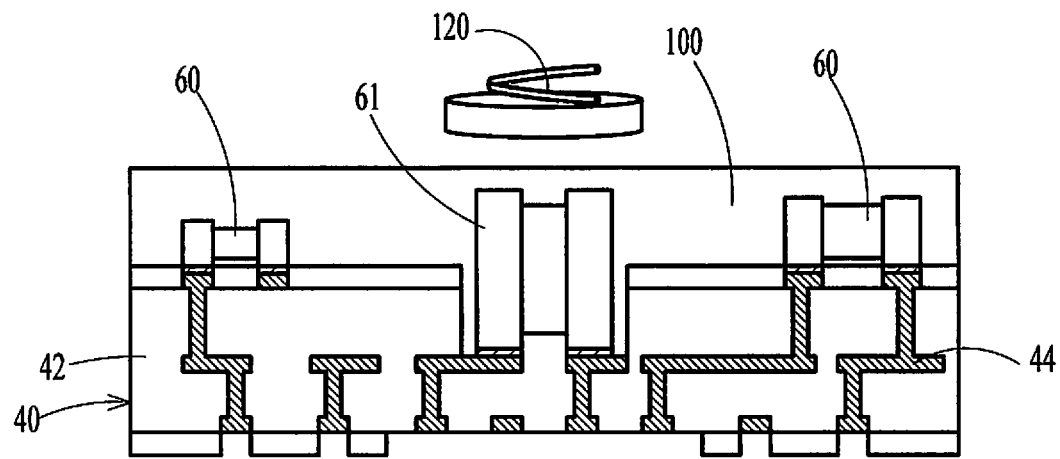

Next, as shown in FIG. 7, top mold grinding 120 is performed to approach the top side target thickness, for example, 70 μm. This completes the top side assembly process. For the bottom side assembly process, the substrate is flipped so that the bottom side faces up in the following drawing figures.

Figure 8:
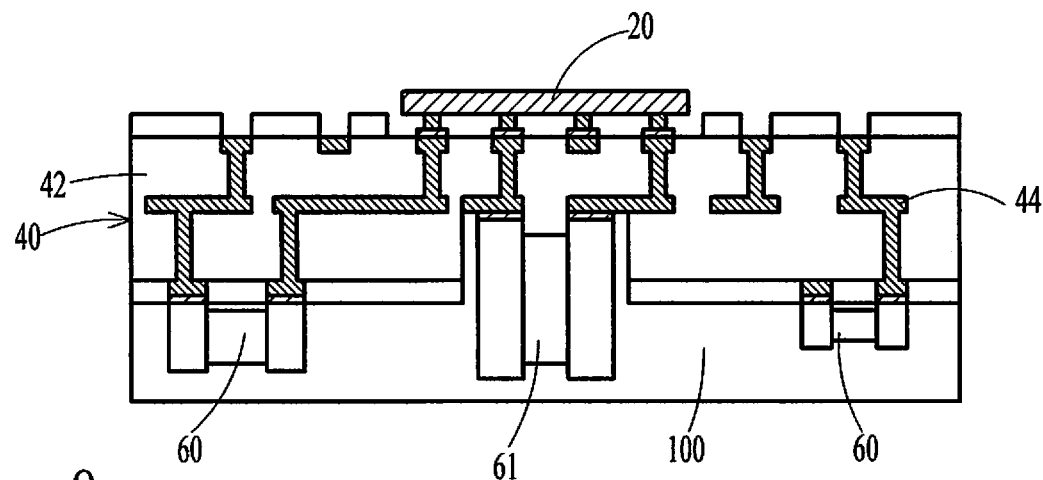
Figure 9:
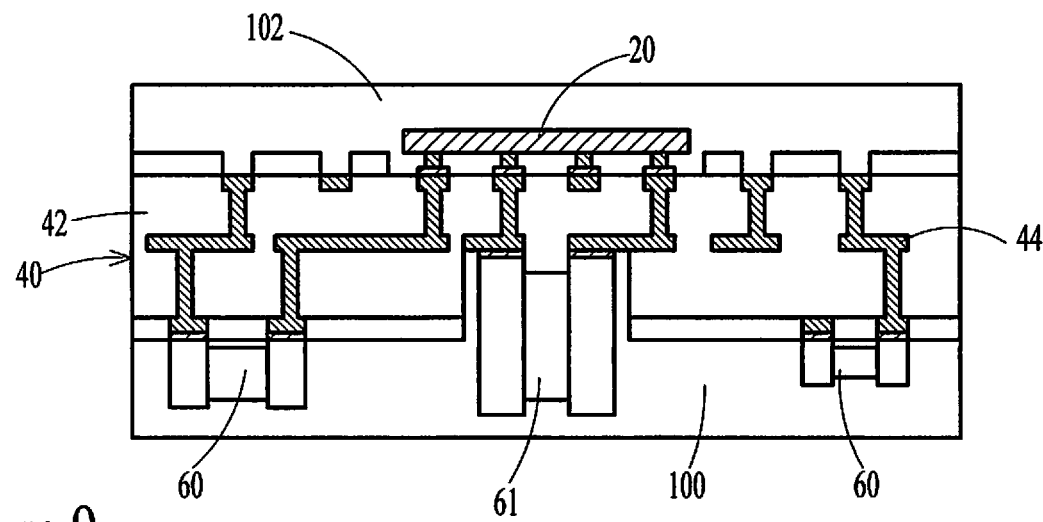
Figure 10:
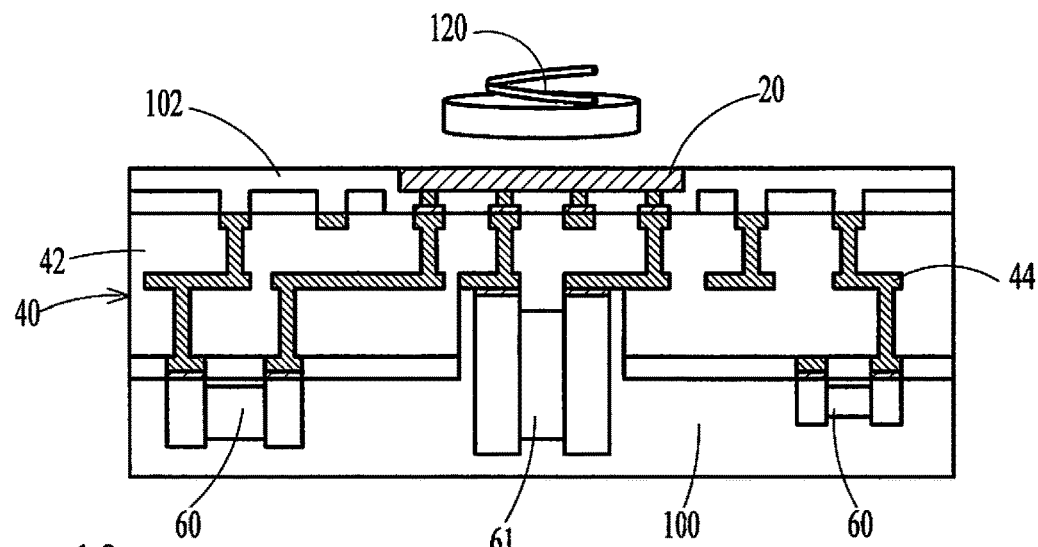

Referring now to FIG. 8, a flip chip die 20 is attached to the substrate bottom side using a standard die attach process. Now, as shown in FIG. 9, a bottom compression molding process is performed using molding compound 102 to mold the substrate strip. Next, bottom mold grinding 120 is performed to approach the bottom side target thickness of for example, 80 μm, as shown in FIG. 10. The bottom grinding process will grind the molding compound 102 and the silicon die 20 at the same time.

Figure 11:
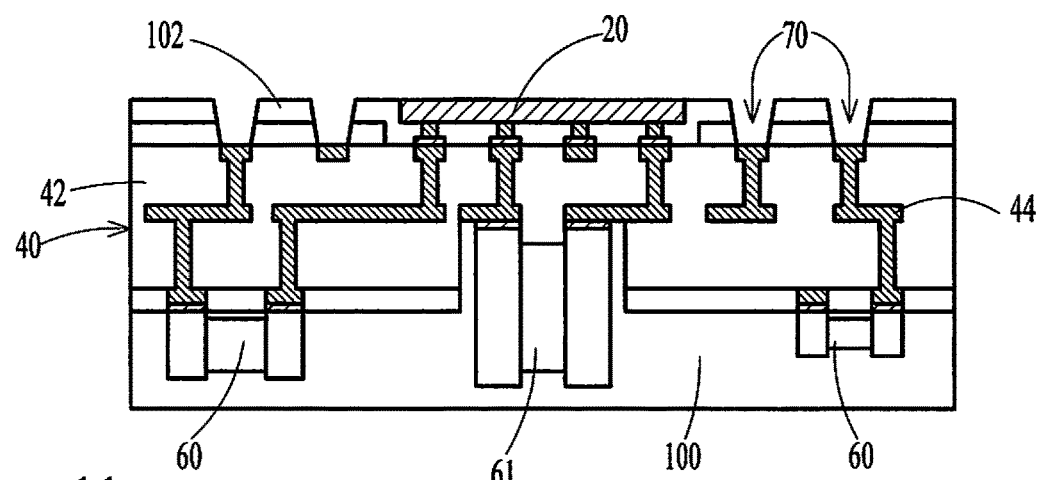
Figure 12:
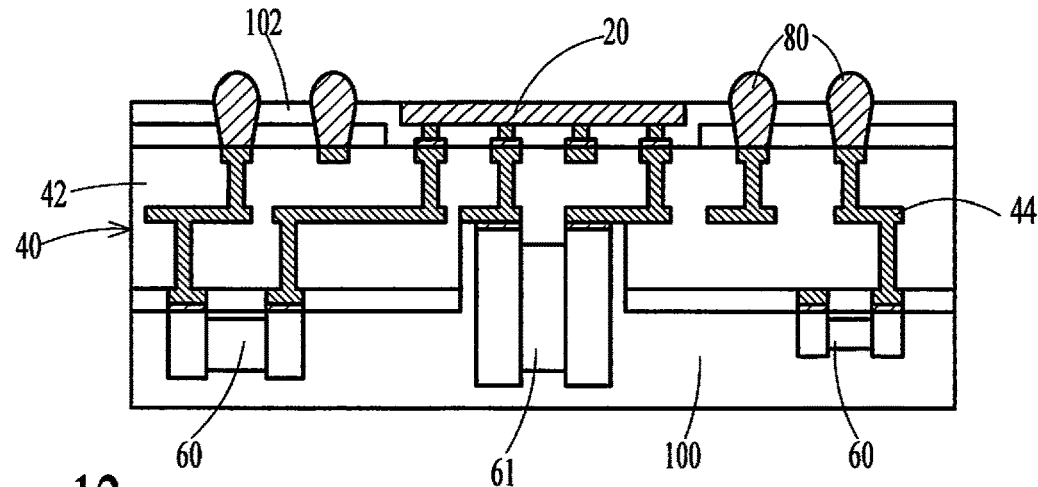

Now, as shown in FIG. 11, preferably a laser ablation process is used to form via openings 70 to expose the substrate pads where solder balls will be placed. Solder balls 80 are placed into the via openings 70 contacting the substrate pads, as shown in FIG. 12. The bottom side assembly is completed and the completed packages are singulated.

In post-processing, a printed circuit board (PCB), not shown, will be attached to the solder balls 80. The solder balls are the package output which communicate the signal between the top side devices 60 and 61 (passive devices, sensors, memory) and the bottom silicon die 20.

Any substrate type package can use the cavity concept of the present disclosure. Advantages include:
1. Reducing the total package height of the SIP by mounting or burying the passive component into a substrate cavity structure, and
2. Increasing the substrate thickness to have a better handling/load-unload robustness and manufacturability in the substrate and assembly process, due to rigidity of the substrate and warpage performance.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A system in package comprising:
    a substrate having a top side and a bottom side, having redistribution layers therein, and having at least one cavity extending partially into said top side of said substrate;
    at least one passive component mounted on said top side of said substrate and into said at least one cavity and embedded in a first molding compound;
    at least one silicon die mounted on said bottom side of said substrate and embedded in a second molding compound wherein electrical connections are made between said at least one silicon die and said at least one passive component through said redistribution layers; and
    solder balls mounted through openings in said second molding compound to said redistribution layers wherein said solder balls provide package output.

2. The system in package according to claim 1 wherein said substrate is an embedded trace substrate.

3. The system in package according to claim 1 wherein there are two or more passive components and wherein taller of said passive components are embedded each in its own said cavity and wherein shorter of said passive components are mounted on said substrate outside of said at least one cavity.

4. The system in package according to claim 1 wherein said first and second molding compound comprises an epoxy resin.

5. A system in package comprising:
    an embedded trace substrate comprising:
        an inner pre-impregnated material layer;
        at least three metal redistribution layers within said impregnated material; and
        at least one cavity in a top side of said substrate exposing said metal distribution layers;
    at least one passive component mounted in said at least one cavity and contacting said metal redistribution layers and embedded in a first molding compound;
    at least one silicon die mounted on a bottom side of said embedded trace substrate and embedded in a second molding compound wherein electrical connections are made between said at least one silicon die and said at least one passive component through said metal redistribution layers; and
    solder balls mounted through openings in said second molding compound to said metal redistribution layers wherein said solder balls provide package output.

6. The system in package according to claim 5 wherein said substrate is an embedded trace substrate.

7. The system in package according to claim 5 wherein there are two or more passive components and wherein taller of said passive components are embedded each in its own said cavity and wherein shorter of said passive components are mounted on said substrate outside of said at least one cavity.

8. The system in package according to claim 5 wherein said first and second molding compound comprises an epoxy resin.

* * * * *